(12) United States Patent
Watanabe et al.

(10) Patent No.: US 7,388,893 B2
(45) Date of Patent: Jun. 17, 2008

(54) VERTICAL-CAVITY SURFACE-EMITTING LASER DEVICE ARRAY AND METHOD OF MANUFACTURING THE SAME

(75) Inventors: Yoshiaki Watanabe, Kanagawa (JP);
Hironobu Narui, Kanagawa (JP);
Yoshinori Yamauchi, Kanagawa (JP);
Yuichi Kuromizu, Kanagawa (JP);
Yoshiyuki Tanaka, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/465,338

(22) Filed: Aug. 17, 2006

(65) Prior Publication Data
US 2006/0285568 A1 Dec. 21, 2006

Related U.S. Application Data

(63) Continuation of application No. 10/944,386, filed on Sep. 17, 2004, now Pat. No. 7,099,364.

(30) Foreign Application Priority Data
Oct. 10, 2003 (JP) .................... P2003-351935

(51) Int. Cl.
*H01S 5/00* (2006.01)
(52) U.S. Cl. .................. 372/50.124; 372/50.121; 372/50.12
(58) Field of Classification Search ........... 372/46.013, 372/46.014, 46.015, 50.12, 50.121, 50.124
See application file for complete search history.

(56) References Cited

U.S. PATENT DOCUMENTS

| 5,717,891 A | * | 2/1998 | Potts et al. .............. 711/125 |
| 5,719,891 A | | 2/1998 | Jewell |
| 6,084,900 A | * | 7/2000 | Claisse et al. .......... 372/50.124 |
| 6,320,893 B1 | * | 11/2001 | Ueki ....................... 372/96 |
| 6,959,025 B2 | * | 10/2005 | Jikutani et al. ........... 372/46.01 |
| 7,099,364 B2 | * | 8/2006 | Watanabe et al. ........ 372/46.013 |
| 2004/0114645 A1 | * | 6/2004 | Wang et al .............. 372/29.022 |

FOREIGN PATENT DOCUMENTS

| JP | 11-220206 A | * | 8/1999 |
| JP | 2000-294873 A | * | 10/2000 |
| JP | 2005-044964 | | 2/2005 |

OTHER PUBLICATIONS

Office Action for Japanese Application No. 2003-351935 dated Sep. 19, 2007.

* cited by examiner

*Primary Examiner*—Minsun Harvey
*Assistant Examiner*—Tod T Van Roy
(74) *Attorney, Agent, or Firm*—Sonnenschein Nath & Rosenthal LLP

(57) ABSTRACT

A plurality of vertical-cavity surface-emitting laser devices each having a different lasing wavelength are arrayed by a simple structure and a manufacturing process without increasing device resistance. Each vertical-cavity surface-emitting laser device comprises a layered structure including an active layer and a current confinement layer. The area of current confinement portion in the laminate structures is set corresponding to a wavelength of laser light emitted from each vertical-cavity surface-emitting laser device. Thereby, the plurality of vertical-cavity surface-emitting laser devices emits laser light with different lasing wavelengths.

14 Claims, 5 Drawing Sheets

VERTICAL-CAVITY SURFACE-EMITTING LASER DEVICE ARRAY AND METHOD OF MANUFACTURING THE SAME

CROSS REFERENCES TO RELATED APPLICATIONS

This application is a continuation of and claims the benefit of priority to U.S. application Ser. No. 10/944,386, filed Sep. 17, 2004, now U.S. Pat. No. 7,099,364 which is incorporated herein by reference to the extent permitted by law. This application also claims the benefit of priority to Japanese Patent Applications P2003-351935, filed Oct. 10, 2003.

BACKGROUND OF THE INVENTION

The present invention relates to a vertical-cavity surface-emitting laser device array having layered structures such as a columnar mesa formed by laminating at least an active layer and a current confinement layer, and to a method of manufacturing the vertical-cavity surface-emitting laser device array.

Conventionally, a vertical-cavity surface-emitting laser (VCSEL) device in which a layered structure laminating at least an active layer and a current confinement layer as typified in a columnar mesa structure is formed in an island shape has been generally used.

The columnar mesa structure is fabricated as follows. The layered structure is processed in a columnar shape having a mesa diameter of about 30 .mu.m by dry etching or the like and then selectively oxidize the current confinement layer made of AlAs to provide a current confinement structure for efficiently injecting current into the active layer. Almost whole the columnar mesa structure is coated with an insulating film such as a dielectric film and part of the top of the mesa is selectively removed to form an aperture, thereby providing a ring electrode having a light output window.

The VCSEL device has a preferable characteristic as a light-emitting device. That is, because of the presence of the current confinement layer, current is efficiently injected into the VCSEL device, so the VCSEL device can oscillate laser efficiently.

The main structure of the VCSEL device can be arrayed two-dimensionally on a surface of, for example, silicon wafer, therefore this is suitable for an array essentially. The lasing wavelength of the VCSEL changes depending on mainly its structure, particularly a layer thickness around the active layer corresponding to a cavity length. In general, the film thickness distribution of an epitaxially grown film is extremely small, for example 0.5% or less, so the lasing wavelength of the VCSEL hardly changes in the same wafer. The transverse mode of the VCSEL is defined corresponding to the structure of the active layer, the oxidized confinement portion, the light output window of the electrode and so on. The lasing threshold and the lasing wavelength are the same value in the same mode. Therefore, when arraying a plurality of VCSEL devices on one substrate, the lasing wavelength of each VCSEL device constructing the array can conform to each other.

However, in the field requiring large information transmission quantity such as optical communication and optical wiring, it is desirable that the lasing wavelength of each VCSEL device constructing the array differs from each other to realize a so-called WDM (Wavelength Division Multiplexing) transmission.

As a method for controlling the lasing wavelength of the VCSEL, a method using a micro cavity utilizing a movable solenoid, a method changing the film thickness of the active layer by selective growth, a method changing a columnar diameter of micro mesa (refer to Japanese Unexamined Patent Application Publication No. H11-220206) and so on have been proposed.

However, the above-mentioned conventional methods have problems as described below.

In case of using a movable solenoid, the control of the solenoid is required in addition to the laser, and the wavelength is unstable.

In case of using selective growth, the growth is required twice, so the process becomes complicated. In addition, there is a problem that a steepness of a boundary of a DBR (Distributed Bragg Reflector) layer is lowered due to two-times epitaxial growth.

In case of changing the mesa diameter, an electrode contact area and mesa volume are small. This increases device resistance and causes a problem that it is difficult to realize a high output VCSEL device.

SUMMARY OF THE INVENTION

In view of the foregoing, it is an object of the invention to provide a vertical-cavity surface-emitting laser device array capable of arraying a plurality of devices each having different lasing wavelengths by simple structure and manufacturing process without increasing device resistance, and a method of manufacturing a vertical-cavity surface-emitting laser device array.

A vertical-cavity surface-emitting laser device array of the invention is an array, wherein a plurality of vertical-cavity surface-emitting laser devices each having a layered structure laminating at least an active layer and a current confinement layer are provided on one substrate, and each of the plurality of vertical-cavity surface-emitting laser devices comprises the current confinement layer having a current confinement portion with a different area.

A method of manufacturing a vertical-cavity surface-emitting laser device array of the invention is a method, wherein when manufacturing the vertical-cavity surface-emitting laser device array of the invention, an area of each current confinement portion of the current confinement layer in the plurality of vertical-cavity surface-emitting laser devices is changed corresponding to a wavelength of laser light emitted by each of the vertical-cavity surface-emitting laser devices.

In the vertical-cavity surface-emitting laser device array or the method of manufacturing thereof of the invention, the area of the current confinement portion in the current confinement layer of each vertical-cavity surface-emitting laser device is set corresponding to output wavelength of each device. Therefore, a plurality of vertical-cavity surface-emitting laser devices having different oscillation wavelengths are arrayed by a simple structure and a manufacturing process without increasing device resistance.

Further, the structures and the materials of the layered structures are the same, and only the areas of the current confinement portions differ each other. This achieves further simple manufacturing process.

Furthermore, each of a plurality of vertical-cavity surface-emitting laser devices comprises a current confinement layer formed with the current confinement portion which is formed by oxidation confinement. The whole sizes of the layered structures are different from each other and an area of each current confinement portion differs corresponding to the whole size of the layered structure. This achieves further simple manufacturing process.

Other and further objects, features and advantages of the invention will appear more fully from the following description.

DETAILED DESCRIPTION OF THE PREFERRED EMBODIMENTS

Preferred embodiments of the invention will be described in more detail below referring to the accompanying drawings.

Figure 1:
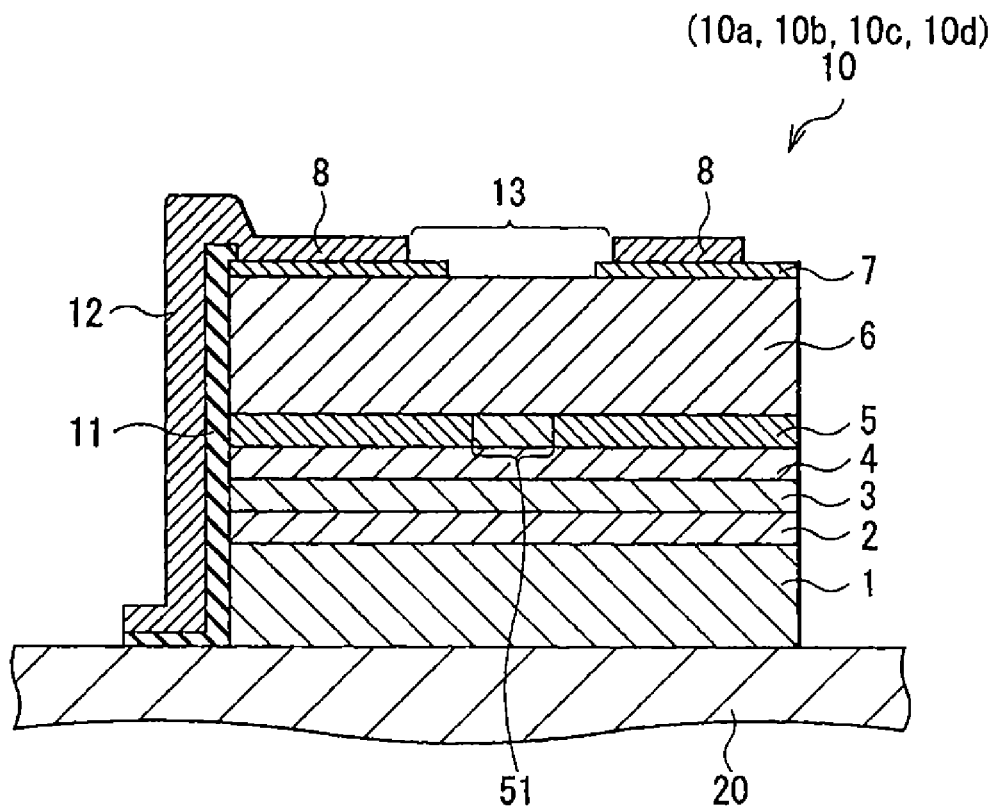
FIG. 1 is a cross sectional view illustrating a structure of a main part of a VCSEL device in a VCSEL device array according to an embodiment of the invention.

FIG. 1 illustrates a structure of a main part of a VCSEL device in a VCSEL device array according to an embodiment of the invention.

The main part of the VCSEL device in the VCSEL device array comprises a layered structure 10 (10a, 10b, 10c, and 10d) including an n-type DBR layer 1, an n-type cladding layer 2, an active layer 3, a p-type cladding layer 4, a current confinement layer 5, a p-type DBR layer 6, a contact layer 7 and an electrode 8 on a surface of a substrate 20 in this order, an insulating film 11 and a wiring 12 both of which are formed on one side of the layered structure 10. The substrate 20 is preferably made of GaAs.

The n-type DBR layer 1 and the p-type DBR layer 6 are composed of multilayer film alternately laminating a semiconductor layer having a small refractive index and a semiconductor layer having a large refractive index such as a combination of AlGaAs and GaAs, and about 20 sets of them having a film thickness of .lambda./4 n (.lambda. represents a lasing wavelength and n represents an integer number) are laminated. Thereby, the light emitting from the active layer 3 is reflected on the n-type DBR layer 1 and the p-type DBR layer 6 at a reflectance of approximately 99%. The n-type DBR layer 1 and the p-type DBR layer 6 provided above and below the active layer 3 generate laser oscillation by resonating the emitted light.

The current confinement layer 5 is placed to be a, for example, second layer from the active layer 3 and is made of AlAs as a main material. A current confinement portion 51 (51a, 51b, 51c and 51d) is formed in the current confinement layer 5 by an oxidation confinement process by steam. The current confinement layer 5 passes current through only the current confinement portion 51 intensively.

The active layer 3 forms a multi quantum well (MQW) of GaAs and AlGaAs. The active layer 3 receives electron injected from the electrode 8 and aggregated on the current confinement portion 51, and generates simulated emission light.

The p-type cladding layer 4 and the n-type cladding layer 2 placed sandwiching the active layer 3 have a smaller refractive index than the active layer 3 and confine electron injected into the active layer 3.

The contact layer 7 is provided for connecting the p-type DBR layer 6 to the electrode 8 for ohmic contact and is made of high-doped GaAs, for example.

The electrode 8 is provided on the top of the layered structure 10 and has a light output window 13 in the center thereof. The laser light is emitted to outside through the light output window 13. The insulating film 11 prevents electrical short circuit, current leakage or the like between the wiring 12 which is made of a metal material and provided on the insulating film 11, and the slope of the layered structure 10. The wiring 12 is provided to continue into the electrode 8 and electrically conducts between the wiring (not illustrated) on the surface of the substrate 20 and the electrode 8 in order to supply the electrode 8 with current.

As described, the VCSEL device in the VCSEL device array has the current confinement portion (oxidized confinement structure) 51 formed by oxidizing the current confinement layer 5 made of AlAs from the periphery thereof to the inside thereof. The area or dimension of the current confinement portion 51 is set to correspond to a wavelength of the laser light emitted by the VCSEL device.

More specifically, the dimension, especially the dimension or area of the whole current confinement layer 5, of the layered structure 10 is set in advance to a size corresponding to a center wavelength of the laser light oscillated by the VCSEL device. After that, the oxidation confinement is performed on the current confinement layer 5 as mentioned above to form the current confinement portion 51 having the dimension (area) corresponding to the dimension of the layered structure 10. In the result, the respective VCSEL devices in the VCSEL device array emit laser light with different lasing wavelengths because of the presence of the current confinement portion 51.

It is desirable that the structure and the material of the layered structure 10 are identical in all the VCSEL devices in the VCSEL device array and only the area of the current confinement portion 51 of the current confinement layer 5 in each VCSEL device differs.

Next, a manufacturing process of the VCSEL device array, particularly the forming process of the current confinement layer will be explained.

The n-type DBR layer 1, the n-type cladding layer 2, the active layer 3, the p-type cladding layer 4, the current confinement layer 5, the p-type DBR layer 6 and the contact layer 7 are formed in this order on the substrate 20 by MOCVD (Metal Organic Chemical Vapor Deposition).

Figure 2:
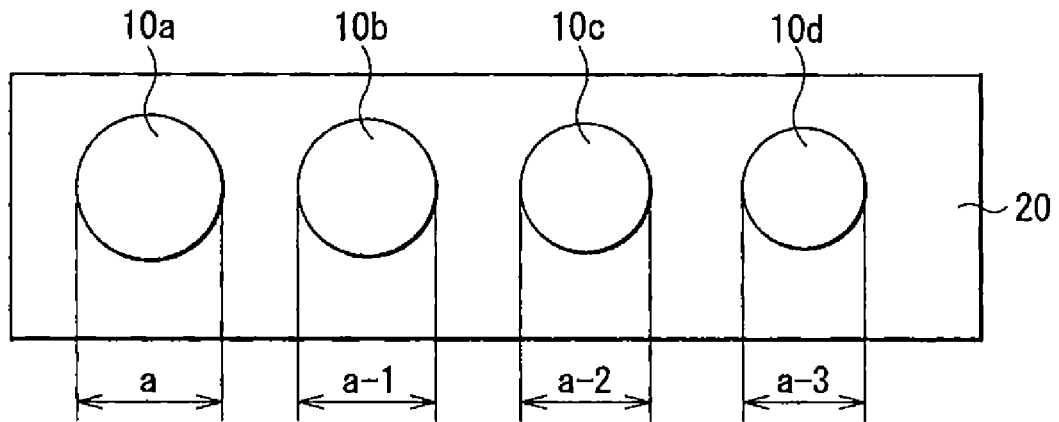
FIG. 2 is a plan view of a plurality of layered structures in the VCSEL device array.

The above flat laminates are patterned by photolithography to form the array of the layered structure 10 each having a columnar mesa structure whose diameter is slightly different by around 30 .mu.m in planar shape as illustrated in FIG. 2. At this point, although no current confinement portion 51 is provided in the current confinement layer 5, in this process, the diameter of each layered structure 10 (10a, 10b, 10c and 10d) of a plurality of VCSEL devices forming the array are set to a size in which the area of the current confinement portion 51 (51a, 51b, 51c and 51d) corresponding to the lasing wavelength of laser light emitted from each VCSEL device can be formed in the later oxidation confinement process.

The side wall of the layered structure 10 is required to be steep to efficiently inject current, so the anisotropic etching is preferably performed in the patterning process by photolithography for forming the array of the layered structure 10. Specifically, the dry etching is preferable as the anisotropic etching process. Chlorine gas is preferably used in case of the layered structure 10, which is made of GaAs base material like the embodiment, as an etching gas.

Subsequently, the ring electrode 8 is provided on the surface of the top layer of the layered structure 10. The inside diameter of the light output window 13 in the electrode 8 defines the mode of the emitting light, so the light output window 13 is formed to have a size corresponding to a desired emitting light.

The current confinement layer 5 is oxidized from the periphery thereof to the inside thereof by, for example, steam exposure (steam oxidation) on the entire layered structure 10. The oxidation confinement is stopped after a certain time passed. Thereby, the current confinement portion 51 is formed in the center of the current confinement layer 5. In general, if the diameter or diagonal length of the current confinement portion 51 is about 15 .mu.m or less, carrier is intensively injected into the active layer 3 formed under the current confinement portion 51 and efficient laser light oscillation is performed, thereby the laser is emitted efficiently.

The wavelength of the laser light emitted from the VCSEL device is nearly defined by two elements: (1) the optical length of the cavity which is determined by the thicknesses of the active layer 3 and each layer thereabound; and (2) the effective refractive index corresponding to the transverse mode which is determined by the device structure. In order to individually set the lasing wavelength of each VCSEL device which is provided on one substrate and forms the VCSEL device array, both of or either one of above two elements (1) and (2) are/is controlled to obtain a desired lasing wavelength.

In the VCSEL device array of the embodiment, before the oxidation confinement, the planar dimension (diameter) of the layered structure 10 of each device is set to have a different value by several .mu.m on the basis of the reference dimension (diameter) of a few tens of .mu.m.

More specifically, as an example illustrated in FIG. 2, the diameter of the layered structure 10 of each VCSEL device is changed by 1 .mu.m on the basis of the reference value "a" which is within the range of about 30 .mu.m to 40 .mu.m (for example, the reference value "a" is 30 .mu.m). In this example, the diameter of the layered structure 10 of each VCSEL device is a=30 .mu.m, a−1=29 .mu.m, a−2=28 .mu.m and a−3=27 .mu.m from the left side in FIG. 2.

Figure 3:
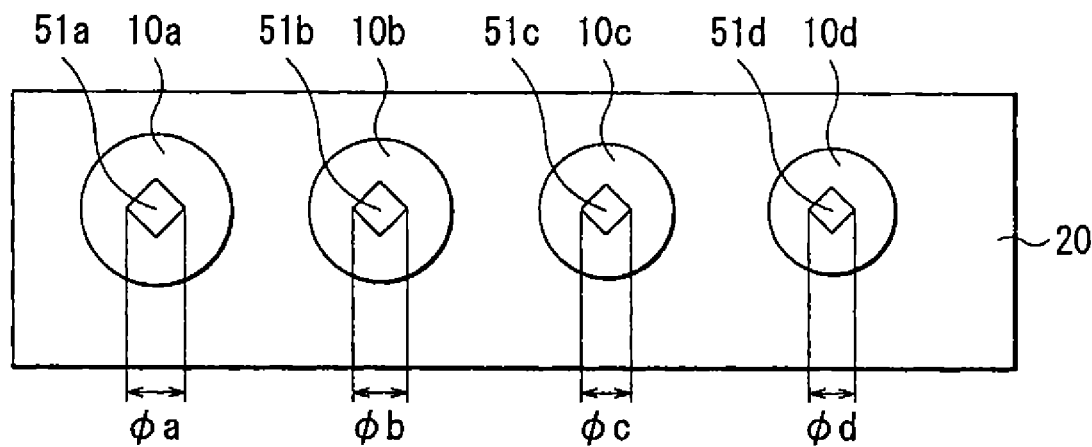
FIG. 3 is a plan view of a plurality of current confinement portions in the VCSEL device array.

The entire array formed with the VCSEL devices each having a different dimension is steam oxidized to form the current confinement portion 51 each having a different dimension (diagonal length) in the current confinement layer 5 of each VCSEL device corresponding to the diameter of the layered structure 10 as an example illustrated in FIG. 3.

In the example illustrated in FIG. 3, the dimension (diagonal length .phi.a, .phi.b, .phi.c and phi.d) of the current confinement portion 51 (51a, 51b, 51c and 51d) is .phi.a=about 10 .mu.m, .phi.b=about 9 .mu.m, .phi.c=about 8 .mu.m and .phi.d=about 7 .mu.m from the left of the array. Each current confinement portion 51 is a similar figure in square, so the area thereof is different from each other and the area ratio is 100:81:64:49.

The electrodes 8 having the same size (the diameter of light output window is, for example, 15 .mu.m) and shape (ring shape) are provided on the respective layered structures 10.

The VCSEL device array comprising the current confinement portions 51 each having a different area has different lasing wavelengths by the device according to mainly two actions which will be mentioned below.

First, since the area of current confinement portion 51 differs in each device, the threshold current required for the laser oscillation differs and actually the loss during the oscillation differs. Therefore, the small area of the current confinement portion 51 increases the current density. This changes the refractive index in the active layer 3 in the state that the laser is oscillated when the electrode 8 supplies the active layer 3 with current (a plasma effect by the carrier). More specifically, when the area of the current confinement portion 51 is small, the current density increases and the refractive index of the active layer 3 is reduced. This leads to a change in the effective cavity length and in the lasing wavelength.

Second, when the area of the current confinement portion 51 is small, the columnar waveguide structure formed around the active layer 3, that is the distribution of the refractive index to the oscillation light changes. This results in a change in the output of the laser light. In this case, the shape of the waveguide is approximated in the columnar shape, thereby obtaining the following formula:

$$(2\pi \cdot N_{eff}/\lambda)^2 = \beta^2 + \beta_t^2$$

where Neff represents the effective refractive index of the columnar waveguide structure, .lambda. represents the lasing wavelength, .beta. represents the propagation constant in the direction of cylindrical axis and .beta.t represents the propagation constant in the vertical direction to the cylindrical axis.

.beta.t is inversely proportional to the cylindrical diameter and gets larger when the area of the current confinement portion 51 gets smaller. Accordingly, assuming .beta. is almost constant, when the confinement diameter gets smaller, .lambda. gets shorter.

It is assumed that the correlation in which the lasing wavelength of the VCSEL device is shortened corresponding to the area (size) of the current confinement portion 51 is established from the above two actions.

With such actions, in the array comprising the current confinement portions 51 whose dimensions are different by 1 .mu.m, the lasing wavelength of each VCSEL device is supposed to be changed by several nm.

As described above, the VCSEL device array in which the current confinement portions 51 had different areas by the layered structure 10 of each VCSEL device was fabricated and the laser output was confirmed. Specifically, the dimension (diagonal length) of the current confinement portion 51 of each VCSEL device was respectively set to 9 .mu.m, 8 .mu.m, 7 .mu.m, and 6 .mu.m. In the result, it was confirmed that the lasing wavelength apparently differs corresponding to the size of the current confinement portion 51.

Figure 4:
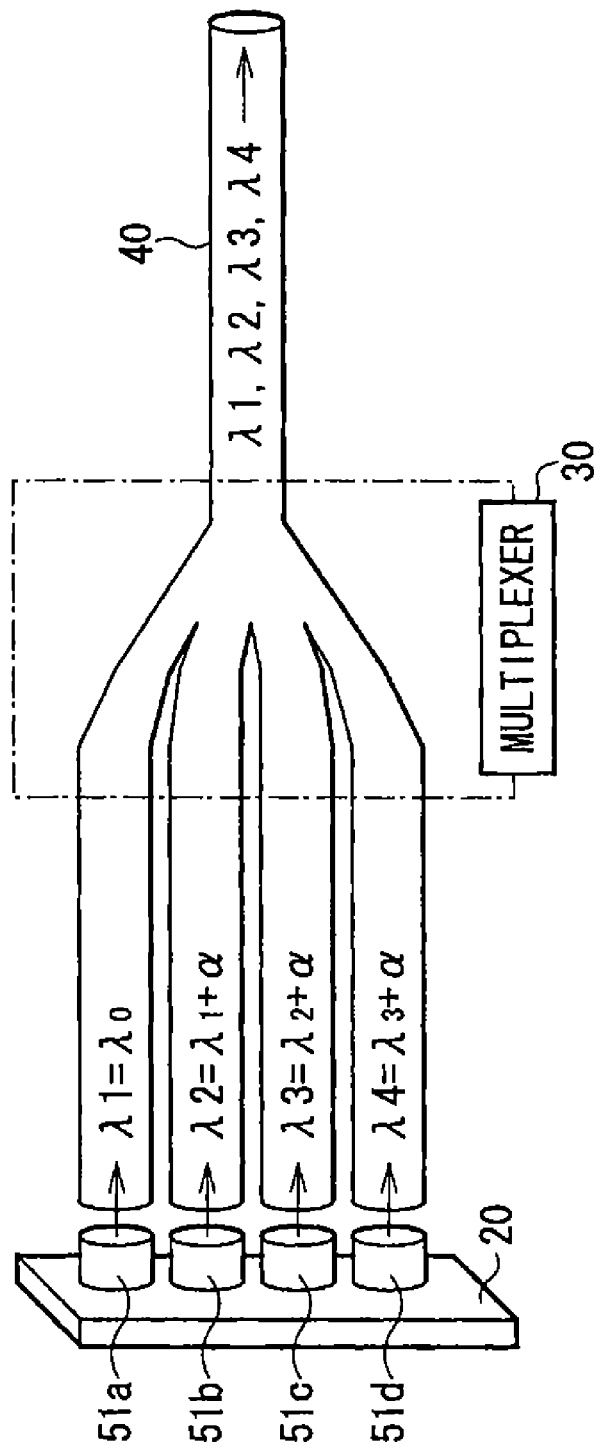
FIG. 4 illustrates an application example of the VCSEL device array as a light source.

The above mentioned VCSEL device array can be applied as a WDM light source in the optical communication system having a multiplexer 30 and an optical fiber transmission line 40 as an example illustrated in FIG. 4.

In case of applying the VCSEL device array to the WDM light source, it is possible to realize the VCSEL device array emitting laser light in which the lasing wavelength emitted from each device evenly differs by adjacent devices, for example, lambda.1=.lambda.0, .lambda.2=.lambda.1+.alpha., .lambda.3=.lambda.2+.alpha., lambda.4=.lambda.3+.alpha.

Figure 5:
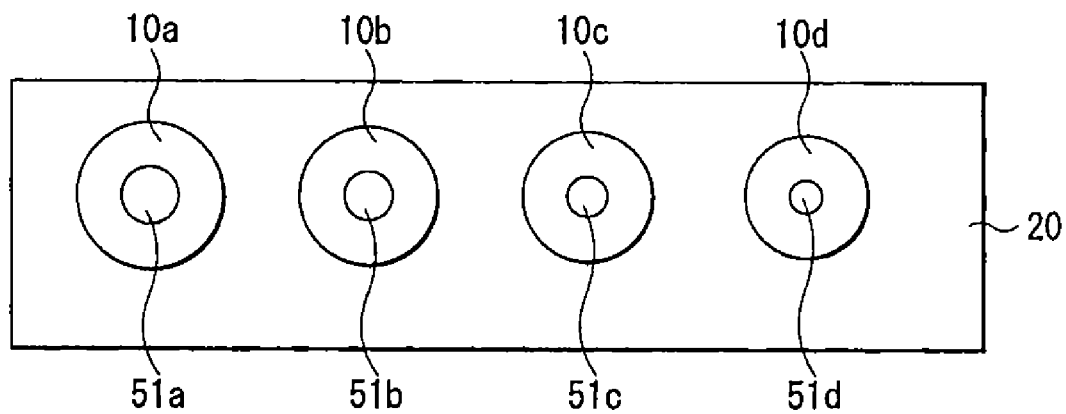
FIG. 5 is a plan view illustrating another current confinement portions.
Figure 6:
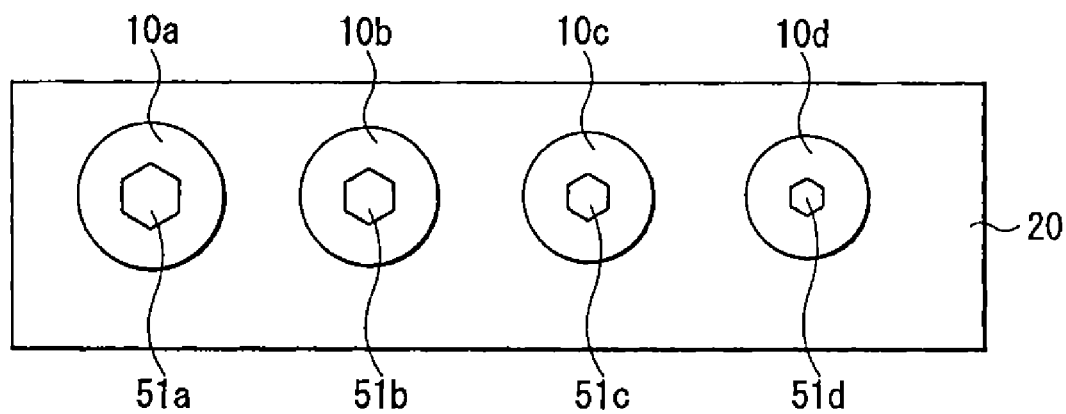
FIG. 6 is a plan view illustrating still another current confinement portions.

In the above embodiment, the description is made in the case where the current confinement portion 51 is planar shape in square. However, the planar shape of the current confinement portion 51 can be a circular shape as illustrated in FIG. 5 and a polygon shape as illustrated in FIG. 6 (hexagonal shape in the figure).

Figure 7:
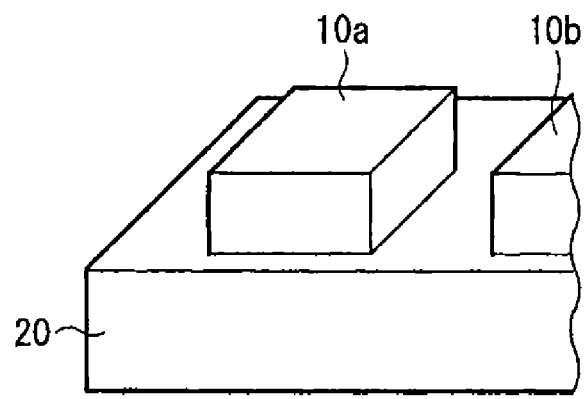
FIG. 7 illustrates an example of an outer shape of the layered structure.
Figure 8:
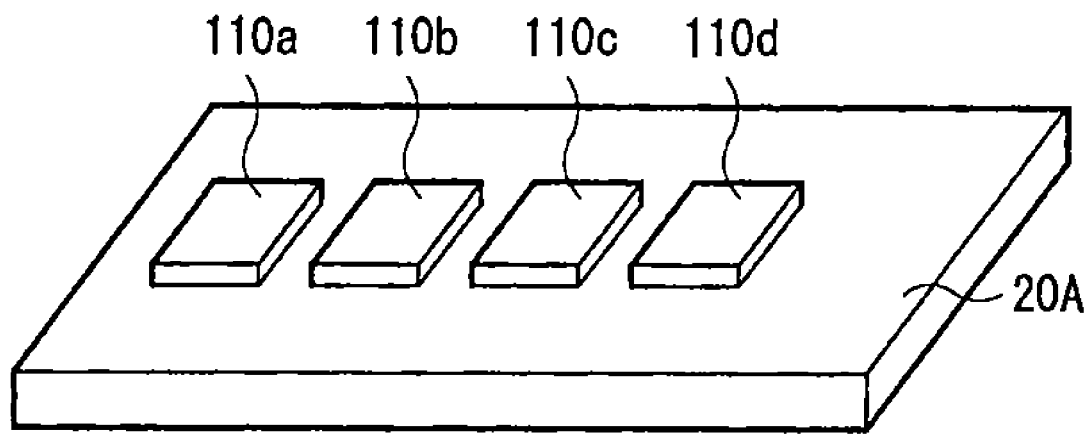
FIG. 8 illustrates another example of an outer shape of the layered structure.

The dimension of the columnar mesa structure of the layered structure 10 can be a rectangular solid shape as illustrated in FIG. 7. In addition, as illustrated in FIG. 8, a plurality of layered structures 10, 10b, 10c and 10d are preformed in one wafer, separated in chips 110a, 100b, 110c and 110d, and the chips are mounted on one substrate 20A to form the VCSEL device array.

Figure 9:
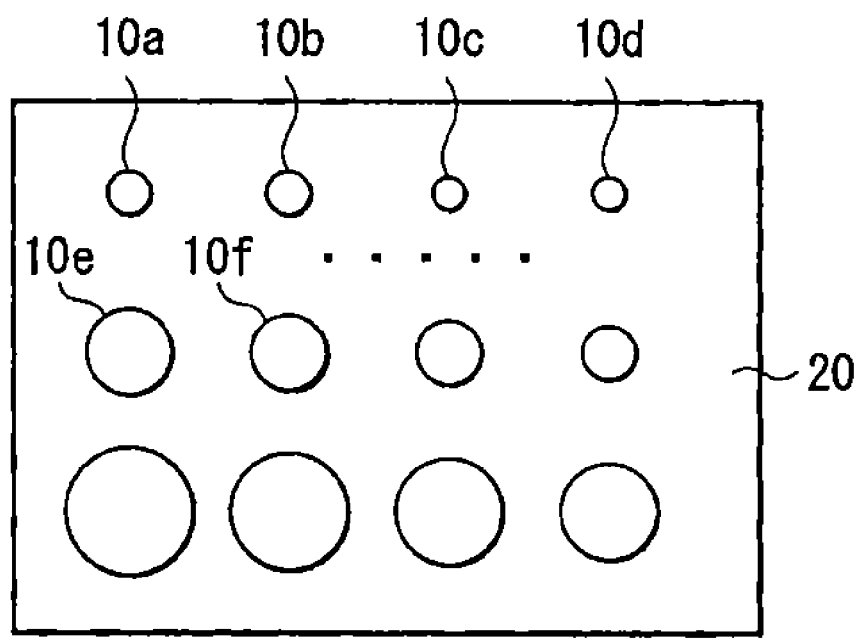
FIG. 9 illustrates an example of arrangement of the VCSEL device array.

Alternatively, in addition to arrange the VCSEL device in inline, as illustrated in FIG. 9, the VCSEL device can be a matrix structure by arranging the VCSEL device (layered structure 10a, 10b, 10c, 10d, 10e, 10f and so on) in matrix.

Obviously many modifications and variations of the present invention are possible in the light of the above teachings. It is therefore to be understood that within the scope of the appended claims the invention may be practiced otherwise than as specifically described.

What is claimed is:

1. An optical system comprising:
    a first optical fiber transmission line;
    a multiplexer for optically coupling the first optical fiber transmission line to a second plurality of optical fiber transmission lines; and
    a vertical-cavity surface-emitting laser device array,
    wherein
        a plurality of vertical-cavity surface-emitting laser devices, each having a layered structure comprising at least an active layer and a current confinement layer, are provided on one substrate,
        each of the plurality of vertical-cavity surface-emitting laser devices has a diameter different than those of the other vertical-cavity surface-emitting laser devices and comprises the current confinement layer having a current confinement portion with an area that is different than those of the current confinement portions of the other vertical-cavity surface-emitting laser devices,
    wherein
    each of the plurality of vertical-cavity surface-emitting laser devices emits laser light towards a respective one of the second plurality of optical fiber transmission lines, and the differences in the lasing wavelength between adjacent vertical-cavity surface-emitting laser devices are the same.

2. The optical system according to claim 1, wherein the differences in the lasing wavelength between adjacent vertical-cavity surface-emitting laser devices are equal to a value α.

3. The optical system according to claim 1, wherein the area of each current confinement portion corresponds to a unique wavelength of laser light emitted from a respective one of the vertical-cavity surface-emitting laser devices.

4. The optical system according to claim 3, wherein only areas of the current confinement portions of the current confinement layers in the layered structures are different from each other.

5. The optical system according to claim 3, wherein whole sizes of the layered structures are different from each other and an area of each current confinement portion differs in correspondence with a difference in a size of each of the layered structures.

6. The optical system according to claim 1, wherein each of the layered structures is a columnar mesa structure.

7. The optical system according to claim 1, wherein dimensions of the layered structures are different from each other.

8. The optical system according to claim 1, wherein each current confinement layer is made of AlAs.

9. The optical system according to claim 1, wherein a planar shape of each current confinement portion is square.

10. A method of manufacturing an optical system, the method comprises:
    providing a first optical fiber transmission line;
    providing a multiplexer for optically coupling the first optical fiber transmission line to a second plurality of optical fiber transmission lines; and
    providing a vertical-cavity surface-emitting laser device array,
    wherein
        a plurality of vertical-cavity surface-emitting laser devices, each having a diameter different than those of the other vertical-cavity surface-emitting laser devices and a layered structure comprising at least an active layer and a current confinement layer, are provided on one substrate, and
        an area of each current confinement portion of the current confinement layer that is different than those of the current confinement portions of the other vertical-cavity surface-emitting laser devices and the diameter of each one of the plurality of vertical-cavity surface-emitting laser devices corresponds to a unique wavelength of laser light emitted by each respective one of the vertical-cavity surface-emitting laser devices, and the area of each current confinement portion is dependent on the corresponding diameter of each respective one of the plurality of vertical-cavity surface-emitting devices,
    wherein,
    each of the plurality of laser devices emits laser light toward a respective one of plurality of optical fiber transmission lines, and the differences in the lasing wavelength between adjacent vertical-cavity surface-emitting devices are the same.

11. The method of manufacturing an optical system according to claim 10, wherein the area of each current confinement portion corresponds to a unique lasing wavelength emitted by each respective one of the plurality of the vertical-cavity surface-emitting laser devices.

12. The method of manufacturing an optical system according to claim 10, wherein whole sizes of the layered structures are different from each other, and the current confinement layers are oxidation confined with the same oxidation confinement process.

13. The method of manufacturing an optical system according to claim 12, wherein the oxidation confinement process is steam oxidation.

14. The method of manufacturing an optical system according to claim 10, wherein each current confinement layer is made of AlAs.

* * * * *